United States Patent
Nguyen et al.

(12)

(10) Patent No.: US 6,811,725 B2
(45) Date of Patent: *Nov. 2, 2004

(54) COMPLIANT AND CROSSLINKABLE THERMAL INTERFACE MATERIALS

(75) Inventors: My N. Nguyen, Poway, CA (US); James Grundy, San Diego, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/446,891

(22) Filed: May 27, 2003

(65) Prior Publication Data

US 2004/0026670 A1 Feb. 12, 2004

Related U.S. Application Data

(62) Division of application No. 09/774,466, filed on Jan. 30, 2001, now Pat. No. 6,605,238.

(51) Int. Cl.$^7$ .......................... H01B 1/04; H01B 1/20; B32B 9/00; C08K 3/04
(52) U.S. Cl. ...................... 252/511; 252/502; 252/512; 252/514; 252/518.1; 252/520.2; 428/343; 428/719; 428/901; 528/10; 524/404; 524/413
(58) Field of Search ................................. 252/502, 511, 252/512, 518.1, 520.2, 514; 524/413, 404; 528/10; 428/343, 901, 457; 264/104

(56) References Cited

U.S. PATENT DOCUMENTS

| 4,790,968 | A | * | 12/1988 | Ohkawa et al. | 264/104 |
|---|---|---|---|---|---|
| 5,227,093 | A | * | 7/1993 | Cole et al. | 252/512 |
| 5,300,569 | A | | 4/1994 | Drake et al. | 525/78 |
| 5,380,770 | A | | 1/1995 | Doin et al. | 523/212 |
| 5,665,473 | A | * | 9/1997 | Okoshi et al. | 428/457 |
| 5,837,119 | A | | 11/1998 | Kang et al. | 205/74 |
| 5,852,092 | A | * | 12/1998 | Nguyen | 524/404 |
| 5,859,105 | A | * | 1/1999 | Nguyen | 524/404 |
| 5,989,459 | A | | 11/1999 | Nguyen et al. | 252/503 |
| 5,990,217 | A | | 11/1999 | Nakano et al. | 524/423 |
| 6,168,442 | B1 | | 1/2001 | Naoi | 439/91 |
| 6,238,596 | B1 | | 5/2001 | Nguyen et al. | 252/502 |
| 6,271,299 | B1 | | 8/2001 | Alvarez et al. | 524/456 |

FOREIGN PATENT DOCUMENTS

JP        04-084444        3/1992

* cited by examiner

*Primary Examiner*—Mark Kopec
*Assistant Examiner*—Kallambella Vijayakumar
(74) *Attorney, Agent, or Firm*—Sandra Thompson; Bingham McCutchen

(57) ABSTRACT

Described is a compliant and crosslinkable thermal interface material of at least one silicone resin mixture, at least one wetting enhancer and at least one thermally conductive filler, and a method of making and using same; as well as a method of improving thermal conductivity of polymer and resin systems.

22 Claims, No Drawings

COMPLIANT AND CROSSLINKABLE THERMAL INTERFACE MATERIALS

This application is a divisional of allowed application Ser. No. 09/774,466, filed Jan. 30, 2001 now U.S. Pat. No. 6,605,238.

This application claims the benefit of U.S. application Ser. No. 09/398,988 incorporated herein by reference in its entirety.

BACKGROUND

As electronic devices become smaller and operate at higher speeds, energy emitted in the form of heat increases dramatically. A popular practice in the industry is to use thermal grease, or grease-like materials, alone or on a carrier in such devices to transfer the excess heat dissipated across physical interfaces. Most common types of thermal interface materials are thermal greases, phase change materials, and elastomer tapes. Thermal greases or phase change materials have lower thermal resistance than elastomer tape because of the ability to be spread in very thin layers and provide intimate contact between adjacent surfaces. Typical thermal impedance values range between 0.6–1.6° C. $cm^2$/w.

A serious drawback of thermal grease is that thermal performance deteriorates significantly after thermal cycling, such as from −65° C. to 150° C., or after power cycling when used in VLSI chips. It has been also found that the performance of these materials deteriorates when large deviations from surface planarity causes gaps to form between the mating surfaces in the electronic devices or when large gaps between mating surfaces are present for other reasons, such as manufacturing tolerances, etc. When the heat transferability of these materials breaks down, the performance of the electronic device in which they are used is adversely affected. The present invention provides a thermal interface material that is particularly suitable for use as an interface material in electronic devices.

SUMMARY OF THE INVENTION

In accordance with the invention there is provided a compliant and crosslinkable material which comprises a silicone resin mixture, such as a mixture of vinyl silicone, vinyl Q resin, hydride functional siloxane and platinum-vinylsiloxane, a wetting enhancer and at least one thermally conductive filler. The compliant thermally conductive material has the capability of enhancing heat dissipation in high power semiconductor devices and maintains stable thermal performance. It is not subject to interfacial delamination or phase separation during thermal-mechanical stresses or fluctuating power cycling of the electronic devices in which it is used.

The compliant and crosslinkable thermal interface material may be formulated by mixing the components together to produce a paste which may be applied by dispensing methods to any particular surface and cured at room temperature or elevated temperature. It can be also formulated as a highly complaint, cured, tacky elastomeric film or sheet for other interface applications where it can be preapplied, for example on heat sinks, or in any other interface situations.

The filler to be incorporated advantageously comprises at least one thermally conductive filler, such as silver, copper, aluminum, and alloys thereof; boron nitride, aluminum nitride, silver coated copper, silver coated aluminum and carbon fiber. It may be also additionally useful to incorporate antioxidants to reduce oxidation of the resins, wetability enhancing agents to promote wetting of surfaces, curing accelerators, such as would allow curing at room temperature, viscosity reducing agents to enhance dispersability and crosslinking aids. It is also often desirable to include substantially spherical particles of filler to limit the compressibility of the compliant material in interface applications, i.e. to limit or control the thickness.

It has been also found that thermal conductivity of resin systems, such as a combination of filler and the combined silicone resin mixture discussed above, can be especially improved by incorporating carbon micro fibers, with other fillers, into the system.

DETAILED DESCRIPTION

A compliant and crosslinkable thermal interface material is formulated by combining a silicone resin mixture, such as a mixture of vinyl silicone, vinyl Q resin, hydride functional siloxane and platinum-vinylsiloxane, an organo-titanate wetting enhancer and at least one thermally conductive filler. More than one silicone resin mixture may be combined to produce a compliant and crosslinkable interface material. Silicone resin containing interface materials, with appropriate thermal fillers, exhibit a thermal capability of less than 0.5 $cm^{2\circ}$ c./w. Unlike thermal grease, thermal performance of the material will not degrade after thermal cycling or flow cycling in IC devices because liquid silicone resins will cross link to form a soft gel upon heat activation. Moreover, when applied as an interface material it will not be "squeezed out" as thermal grease does in use and will not display interfacial delamination during thermal cycling. The new material can be provided as a dispensable liquid paste to be applied by dispensing methods and then cured as desired. It can also be provided as a highly compliant, cured, elastomer film or sheet for pre-application on interface surfaces, such as heat sinks. Advantageously, fillers with a thermal conductivity of greater than about 0.2, and preferably at least about 0.4, w/m° C. will be used. Optimally, it is desired to have a filler of not less than about 1 w/m° C. thermal conductivity. The compliant thermally conductive material enhances thermal dissipation of high power semiconductor devices. The paste may be formulated as a mixture of functional silicone resins and thermal fillers.

As used herein, the term "compliant" encompasses the property of a material that is yielding and formable at room temperature, as opposed to solid and unyielding at room temperature. As used herein, the term "crosslinkable" refers to those materials or compounds that are not yet crosslinked.

A vinyl Q resin is an activated cure specialty silicone rubber having the following base polymer structure:

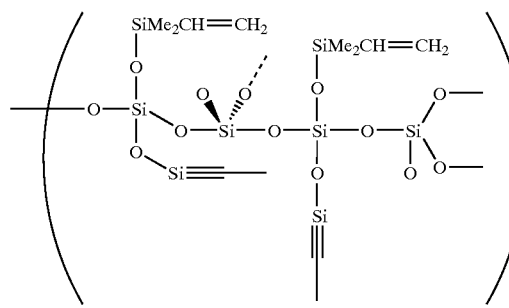

Vinyl Q resins are also clear reinforcing additives for addition cure elastomers. Examples of vinyl Q resin dispersions that have at least 20% Q-resin are VQM-135 (DMS- V41 Base), VQM-146 (DMS-V46 Base), and VQX-221 (50% in xylene Base).

For example, a contemplated silicone resin mixture could be formed as follows:

| Component | % by weight | Note/Function |
|---|---|---|
| Vinyl silicone | 75 (70–97 range) | Vinyl terminated siloxane |
| Vinyl Q Resin | 20 (0–25 range) | Reinforcing additive |
| Hydride functional siloxane | 5 (3–10 range) | Crosslinker |
| Platinum-vinylsiloxane | 20–200 ppm | Catalyst |

The resin mixture can be cured at either at room temperature or elevated temperature to form a compliant elastomer. The reaction is via hydrosilylation (addition cure) of vinyl functional siloxanes by hydride functional siloxanes in the presence of a catalyst, such as platinum complexes or nickel complexes. Preferred platinum catalysts are SIP6830.0, SIP6832.0, and platinum-vinylsiloxane.

Contemplated examples of vinyl silicone include vinyl terminated polydimethyl siloxanes that have a molecular weight of about 10000 to 50000. Contemplated examples of hydride functional siloxane include methylhydrosiloxane-dimethylsiloxane copolymers that have a molecular weight about 500 to 5000. Physical properties can be varied from a very soft gel material at a very low crosslink density to tough elastomer network of higher crosslink density.

Thermal filler particles to be dispersed in the resin mixture should advantageously have a high thermal conductivity. Suitable filler materials include silver, copper, aluminum, and alloys thereof; boron nitride, aluminum spheres, aluminum nitride, silver coated copper, silver coated aluminum and carbon fibers. Combinations of boron nitride and silver or boron nitride and silver/copper also provide enhanced thermal conductivity. Boron nitride in amounts of at least 20 wt. %, aluminum spheres in amounts of at least 70 wt. %, and silver in amounts of at least about 60 wt. % are particularly useful.

Of special efficacy is a filler comprising a particular form of carbon fiber referred to as "vapor grown carbon fiber" (VGCF) such as is available from Applied Sciences, Inc., Cedarville, Ohio. VGCF, or "carbon micro fibers", are a highly graphized type by heat treatment (thermal conductivity =1900 w/m° C.). Addition of about 0.5 wt. % carbon micro fibers provides significantly increased thermal conductivity. Such fibers are available in varying lengths and diameters; namely, 1 mm to tens of centimeters in length and from under 0.1 to over 100 $\mu$m in diameter. One useful form has a diameter of not greater than about 1 $\mu$m and a length of about 50 to 100 $\mu$m, and possess a thermal conductivity of about two or three times greater than with other common carbon fibers having diameters greater than 5 $\mu$m.

It is difficult to incorporate large amounts of VGCF in resin systems such as the silicone resin mixture discussed above. When carbon micro fibers, e.g. (about 1 $\mu$m, or less, are added to the resins they do not mix well because the need to incorporate a large amount of fiber relative to the amount of the resins for beneficial improvement thermal conductivity. However, we have found that relative large amounts of carbon micro fibers can be added to resin systems that have relatively large amounts of other fillers. A greater amount of carbon micro fibers can be added to the resin when added with other fibers than can be added alone to the polymer, thus providing a greater benefit with respect to improving thermal conductivity of the thermal interface material. Desirably, the ratio of carbon micro fibers to polymer is in the range of 0.05 to 0.50 by weight.

It is also advantageous to incorporate substantially spherical filler particles to maximize packing density. Additionally, substantially spherical shapes or the like will also provide some control of the thickness during compaction. Dispersion of filler particles can be facilitated by addition of functional organo metallic coupling agents or wetting agents, such as organosilane, organotitanate, organozirconium, etc. Typical particle sizes useful for fillers in the resin material may be in the range of about 1–20 $\mu$m with a maximum of about 100 $\mu$m. Antioxidants may be added to inhibit oxidation and thermal degradation of the resin mixture gel. Typical useful antioxidants include Irganoz 1076, a phenol type of Irganox 565, an amine type, (at 0.01% to about 1 wt. %), available from Ciba Giegy of Hawthorne, N.Y.

To illustrate the invention, a number of examples were prepared by mixing the components described in Examples A through F below. The examples shown include one or more of the optional additions, e.g., antioxidant, or wetability enhancer. The amounts of such additions may vary but, generally, they may be usefully present in the following approximate amounts (in wt. %): filler up to 95% of total (filler plus resins); wetability enhancer 0.1 to 5% (of total); adhesion promoters 0.01 to 1% (of total) and antioxidant 0.01 to 1% (of total). It should be noted the addition at least about 0.5% carbon fiber significantly increases thermal conductivity. The examples also show various physico-chemical measurements for the contemplated mixtures.

Thermal Paste Examples

| Component | A | B | C | D | E | F |
|---|---|---|---|---|---|---|
| Silicone resin mixture | 25 | 20 | 24.8 | 19.8 | 16 | 12 |
| Epoxy silane | | | 0.1 | 0.1 | 0.1 | 0.1 |
| Silanol terminated vinylsiloxane | | | 0.1 | 0.1 | 0.1 | 0.1 |
| Organo-titanate | | | | | 3.8 | 3.8 |
| Aluminum spheres | 75 | 80 | 75 | 80 | 80 | 84 |
| Viscosity (Pa · s) | 80 | 275 | 78 | 280 | 85 | 180 |
| Adhesive strength (psi) | 100 | 45 | 250 | 180 | 160 | 250 |
| Modulus at 25 C. (Mpa) | 20 | 35 | 22 | 30 | 14 | 28 |
| Thermal Impedance (cm$^2$C/w) | 0.44 | 0.55 | 0.40 | 0.50 | 0.28 | 0.25 |
| Thermal Conductivity (w/mC) | 1.8 | 1.5 | 1.8 | 1.5 | 3.0 | 3.2 |

Epoxy silane and silanol terminated vinyl siloxane are adhesion promoting additives. Organo-titanate acts a wetting enhancer to reduce paste viscosity and to increase filler loading. The organo-titanate used was isopropyl triisostearyl titanate. General structure of organo-titanate is RO—Ti (OXRY) where RO is a hydrolyzable group, X and Y are binder functional groups. Aluminum spheres have particle sizes in the range of 1–20 um.

Thus, specific embodiments and applications of compliant and crosslinkable thermal interface materials have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements components, or steps that are not expressly referenced.

We claim:

1. An electronic device comprising a compliant and crosslinkable material, wherein the material comprises at least one silicone resin mixture and at least one thermally conductive filler, and wherein the at least one silicone resin mixture comprises a vinyl Q resin.

2. The electronic device of claim 1, wherein the material further comprises at least one wetting enhancer.

3. The electronic device of claim 1, wherein the at least one silicone resin mixture comprises a vinyl terminated siloxane, a crosslinker and a catalyst.

4. The electronic device of claim 3, wherein the vinyl terminated siloxane is vinyl silicone.

5. The electronic device of claim 3, wherein the crosslinker comprises a hydride functional siloxane.

6. The electronic device of claim 3, wherein the catalyst comprises a platinum complex.

7. The electronic device of claim 6, wherein the platinum complex is a platinum-vinylsiloxane compound.

8. The electronic device of claim 2, wherein the wetting enhancer comprises an organo-titanite compound.

9. The electronic device of claim 1, wherein the filler comprises at least one of silver, copper, aluminum, and alloys thereof; boron nitride, aluminum nitride, aluminum spheres, silver coated copper, silver coated aluminum, carbon fibers and mixtures thereof.

10. The electronic device of claim 9, wherein the material further comprises carbon micro fibers in addition to at least one other filler.

11. The electronic device of claim 1, wherein the filler comprises carbon micro fibers and at least one other filler comprising silver, copper, aluminum, and alloys thereof; boron nitride, aluminum nitride, silver coated copper, silver coated aluminum, and carbon fibers; and mixtures thereof.

12. The electronic device of claim 1, wherein at least part of the filler comprises substantially spherical particles.

13. The electronic device of claim 1, wherein the material further comprising an antioxidant.

14. The electronic device of claim 13, wherein the antioxidant is present in an amount of 0.01 to 1 weight percent.

15. A dispensable liquid paste comprising a compliant and crosslinkable material, wherein the material comprises at least one silicone resin mixture and at least one thermally conductive filler, and wherein the at least one silicone resin mixture comprises a vinyl Q resin.

16. The dispensible liquid paste of claim 15, further comprising at least one wetting enhancer.

17. The dispensible liquid paste of claim 15, wherein the at least one silicone resin mixture comprises about 70 to about 97 percent by weight of a vinyl-terminated siloxane, about 3 to about 10 percent by weight of a crosslinker and about 20 to about 200 ppm of a catalyst.

18. The dispensible liquid paste of claim 17, wherein the at least one silicone resin mixture comprises about 75 percent by weight of a vinyl-terminated siloxane, about 5 percent by weight of a crosslinker and about 20 to about 200 ppm of a catalyst.

19. The dispensible liquid paste of claim 18, wherein the vinyl-terminated siloxane comprises vinyl silicone.

20. The dispensible liquid paste of claim 18, wherein the crosslinker comprises hydride functional siloxane.

21. The dispensible liquid paste of claim 18, wherein the catalyst comprises platinum-vinylsiloxane.

22. The dispensible liquid paste of claim 15, wherein the at least one silicone resin mixture is curable at room temperature.

* * * * *